(12) United States Patent
Shibata

(10) Patent No.: US 6,818,550 B2
(45) Date of Patent: Nov. 16, 2004

(54) METHOD OF CUTTING A WAFER INTO INDIVIDUAL CHIPS

(75) Inventor: Kazutaka Shibata, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 15 days.

(21) Appl. No.: 10/192,655

(22) Filed: Jul. 11, 2002

(65) Prior Publication Data

US 2003/0013233 A1 Jan. 16, 2003

(30) Foreign Application Priority Data

Jul. 13, 2001 (JP) ......................... 2001-214139

(51) Int. Cl.⁷ .................. H01L 21/48; H01L 21/46
(52) U.S. Cl. .................. 438/633; 438/113; 438/114; 438/459; 438/977
(58) Field of Search ......................... 438/113, 114, 438/460, 977, 633, 459

(56) References Cited

U.S. PATENT DOCUMENTS 6,117,347 A * 9/2000 Ishida ..................... 216/52

6,353,267 B1 * 3/2002 Ohuchi et al. ............ 257/787

FOREIGN PATENT DOCUMENTS

JP        11-150090        6/1999

* cited by examiner

*Primary Examiner*—Thanh Nguyen
(74) *Attorney, Agent, or Firm*—Rabin & Berdo, P.C.

(57) ABSTRACT

A method for manufacturing a semiconductor device which enables favorable back-surface grinding of a semiconductor substrate with preventing a warp in the substrate, thereby manufacturing a thickness-reduced semiconductor device. A projection electrode is formed on a surface of a wafer. A resin layer is formed on the wafer surface to a thickness to bury a top of the projection electrode. A cut groove is formed in the resin layer along a scribe line formed on the wafer. Thereafter, grinding is made on a back surface of the wafer by the use of a grinder or the like. A surface portion of the resin layer is removed by etching or the like, to expose the top of the projection electrode. The wafer is cut along the cut groove to obtain individual semiconductor chip pieces.

9 Claims, 4 Drawing Sheets

METHOD OF CUTTING A WAFER INTO INDIVIDUAL CHIPS

BACKGROUND OF THE INVENTION

1. Technical Field of the Invention

This invention relates to a semiconductor device and method for manufacturing the same.

2. Description of the Prior Art

In order to reduce a semiconductor chip thickness, conventionally the back-surface grinding process has been carried out to grind a back surface of a semiconductor wafer after having formed devices and interconnections (hereinafter, referred to merely as a "wafer"). The back-surface grinding process has been carried out by bonding a soft protection film on a wafer surface and pressurizing the wafer via the film to urge the wafer at its back surface onto a grid stone so that the wafer is rotated in that state.

However, the wafer or chip is handled by a robot in a process after grinding, i.e. in a process to cut a wafer into chips or a process to mount the cut chip onto a leadframe. Accordingly, thickness reduction, if excessively pursued, leads to wafer or chip breakage during handling, thus resulting in yield. In particular, in the present when wafer diameter has increased, there is a fear of readily breaking a wafer having a thickness reduced by back-surface grinding.

In order to solve such a problem, there is a proposal, e.g. by JP-A-11-150090 that projection electrodes are formed on a wafer surface and thereafter a resin layer is formed on the wafer surface to use the resin layer as a protection reinforcing plate. In the manufacturing method of a semiconductor device in the laid-open publication, wafer back-surface grinding is carried out after forming a resin layer and a surface layer of the resin layer is removed by etching, thereby exposing projection electrode summits. Thereafter, the resin layer is removed along the scribe lines. Furthermore, a nitride film as a protection film is formed in an area avoiding the projection electrodes. Thereafter, the wafer is cut along the scribe lines, into individual chips.

In this method, the wafer ground at its back surface is reinforced by the resin layer and also the individual chips cut from the wafer are reinforced by the resin layer. Due to this, the wafer and chip can be handled favorably without breakage. Meanwhile, such a chip can be mounted by connecting the exposed projection electrodes onto the electrodes pads of a circuit board or the like. Accordingly, it is possible to conspicuously reduce the semiconductor device thickness as compared to the structure with connection from an external terminal by the use of a bonding wire or the like.

However, in the manufacturing method of the foregoing prior related art, there is a problem of causing a warp in a wafer due to a difference in thermal expansion/contraction ratio between the wafer and the resin layer in a course of forming a resin layer on a wafer back surface to back surface grinding, as exaggeratedly shown in FIG. 4. In case such a warped wafer is ground with a flat grid stone, the wafer after grinding has a difference in thickness at between a wafer center area and a peripheral area. Accordingly, it is impossible to obtain semiconductor chips in an even thickness. In addition, there is a fear that the semiconductor chips cut from a wafer peripheral region be not thickness-reduced to a thickness as expected.

Accordingly, it is an object of the present invention to provide a manufacturing method making it possible to overcome the above-mentioned technical problems and favorably carry out a back-surface grinding process of a semiconductor substrate by preventing a warp in the semiconductor substrate, thereby suitably manufacture a thickness-reduced semiconductor device.

Another object of the invention is to provide a semiconductor device having a structure easy to reduce the thickness.

SUMMARY OF THE INVENTION

The present invention for resolving the problem is a method for manufacturing a semiconductor device including: a step of forming at least one of a projection electrode and an interconnection on one surface of a semiconductor substrate; a step of forming a resin layer on the one surface of the semiconductor substrate; a grinding process for polishing or grinding the other surface of the semiconductor substrate thereby reducing a thickness of the semiconductor substrate; and a process of forming a cut groove in the resin layer after the process of forming a resin layer but before the grinding process.

It is preferred to carry out the resin-layer forming process and cut-groove forming process with such a brief time spacing as not to cause a problem of a warp in a semiconductor substrate (wafer), or place a resin-layer-formed semiconductor substrate in an temperature controlled environment so as not to cause a large warp in the semiconductor substrate due to a difference in thermal expansion/contraction ratio between the semiconductor substrate and the resin layer before forming a cut groove in the resin layer.

According to the invention, because a cut groove is formed in the resin layer formed on one surface of the semiconductor substrate, no warp is caused due to a difference in thermal expansion/contraction between the semiconductor substrate and the resin layer. This makes it possible to evenly grind a back surface of the semiconductor substrate in a flat state of the semiconductor device. Accordingly, with such a method of manufacturing a semiconductor device, it is possible to obtain a semiconductor substrate having a thickness desirably adjusted. Namely, the semiconductor substrate obtained is evenly thickness-reduced in both a center area and a peripheral area. By cutting the semiconductor substrate into individual semiconductor chips, obtained are thickness-reduced semiconductor chips having an even thickness.

The cut groove is preferably provided in two or more directions (e.g. orthogonal two directions) in order not to cause a warp in any direction on a plane within the semiconductor substrate.

The resin layer is preferably formed covering summits of the projection electrodes or interconnections. Meanwhile, the resin layer preferably has a flat surface. In such a case, the semiconductor substrate can be evenly pressurized at a side formed with the resin layer during grinding. Because the semiconductor substrate or chip after grinding is covered, at its surface, with the resin layer and hence reinforced with protection, there is no fear of breaking the semiconductor substrate or chip during handling thereof. The projection electrodes or interconnections can be exposed at their summits by carrying out a process to remove a surface layer of the resin layer. This process may be by a chemical process such as etching or by a physical process such as grinding.

In the case of exposing the summits of the projection electrodes or interconnections by a physical process such as grinding, the summits of the projection electrodes or interconnections are flush with a surface of the resin layer. Due to this, after carrying out a process to expose the summits of the projection electrodes or interconnections, the semiconductor substrate can be evenly pressurized at one surface to carry out a grinding process on the other surface. Namely, such a semiconductor substrate has a freedom in the order of the processes to be made during manufacture.

The cut grooves may reach the semiconductor substrate or be formed in a depth of within a thickness of the resin layer. Meanwhile, the cut grooves are preferably formed along scribe lines formed to represent boundaries of between individual semiconductor devices on the semiconductor substrate. In this case, obtained is a semiconductor device including: a semiconductor substrate; a resin layer formed on one surface of the semiconductor substrate; and at least one of a projection electrode and an interconnection formed on the one surface of the semiconductor substrate; whereby the semiconductor substrate and the resin layer have, as cut surfaces, side surfaces at least one surface of which is a multi-staged cut surface obtained by cutting twice or more. A step is formed at a boundary between a cut surface formed upon forming the cut groove and a cut surface formed upon scribing.

The multi-staged (usually, two-staged) cut surface may be obtained through cutting the resin layer and part of the semiconductor substrate due to forming a cut groove and thereafter cutting the remaining part of the semiconductor substrate by scribing. Otherwise, the multi-staged cut surface may be obtained through cutting a part of the resin layer due to forming a cut groove and thereafter cutting the remaining part of the resin layer and semiconductor substrate by scribing. Namely, the step in the multi-staged cut surface may be in a region of the resin layer or region of the semiconductor substrate.

The number of cut grooves can be arbitrarily determined as long as the stress applied in the semiconductor substrate is fully reduced. In the case that cut grooves are formed along scribe lines, they may be formed along every scribe line. For example, cut grooves may be formed in a ratio of one per a predetermined number of scribe lines. Where cutting grooves are formed in a ratio of one per two scribe lines in each of orthogonal two directions, a semiconductor chip obtained has multi-staged cut side surfaces for the not-opposed two surfaces, and surfaces cut once upon scribing for the other two side surfaces.

In the case of forming cut grooves along all the scribe lines, the semiconductor chip has multi-staged cut surfaces in all the side surfaces. In case of forming cut grooves in a ratio of one per three or more scribe lines, obtained are semiconductor chips in a plurality of kinds of forms, e.g. those having a multi-staged cut surface only in one of the side surfaces, those having multi-staged cut surfaces in two of the side surfaces, and so on.

The semiconductor chip cut from the semiconductor substrate can be mounted by connecting an exposed part of the projection electrode or interconnection directly onto an electrode pad of a circuit board.

DETAILED DESCRIPTION OF THE INVENTION

Explanation will be made in detail below on an embodiment of the present invention with reference to the accompanying drawings.

Figure 1:
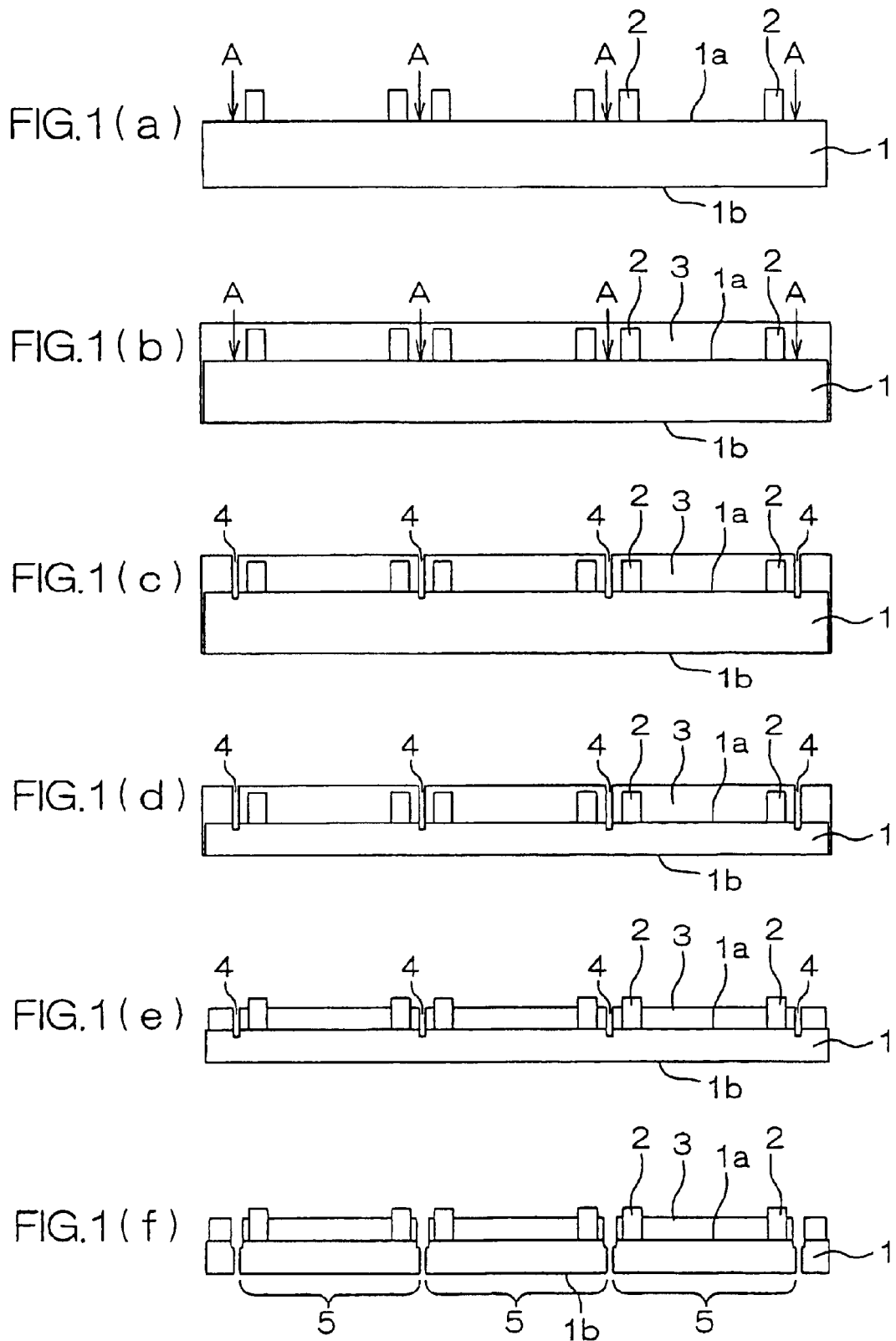
FIG. 1, consisting of FIGS. 1A through 1F, is an illustrative sectional view showing, in a process sequence, a manufacturing method for a semiconductor device according to an embodiment of the present invention.

FIG. 1 is an illustrative sectional view showing, in a process sequence, a method of manufacturing a semiconductor device according to an embodiment of the invention. The semiconductor wafer 1 of FIG. 1 (hereinafter, referred merely to as a "wafer 1"), processed through various device-forming and wiring processes, has a surface 1a, as an activation surface, covered with a protection film (passivation film) of a silicon nitride film or the like. The pads for external electric connection are exposed from the protection film.

As shown in FIG. 1A, a plurality of projection electrodes 2, e.g. of gold (Au), are respectively formed on the pads. The projection electrodes 2 are preferably formed, for example, by electroplating to a height, e.g. of 50 $\mu$m, with respect to the surface of protection film. The projection electrode 2 is preferably in the form of a circular or squared cylinder. The material can use solder, besides gold. Meanwhile, scribe lines are formed at boundaries between individual semiconductor devices, on the surface 1a of the wafer 1 (shown by the arrow A in FIG. 1).

Then, a resin layer 3 is formed on the surface 1a of the wafer 1 (FIG. 1B). The resin layer 3 is obtained by applying a liquefied resin due to the screen-printing process, spin coat process, bar coat process or the like, followed by being cured. The resin may be polyimide or epoxy. The resin layer 3 after cure (hereinafter, referred merely to as a "resin layer 3") is preferably formed in such a thickness as to bury therein the projection electrodes 2. Specifically, the resin layer 3 preferably has a thickness of approximately 100 $\mu$m. Meanwhile, the resin layer 3 is preferably planar in its surface.

Then, after the resin for making a resin layer 3 is cured to such a degree as allowing mechanical working, cut grooves 4 are formed in the resin layer 3 along the scribe lines (FIG. 1C). The cut grooves 4 can be formed reaching the wafer 1 by the use of a dicing blade (dicing saw) or the like.

Figure 2:
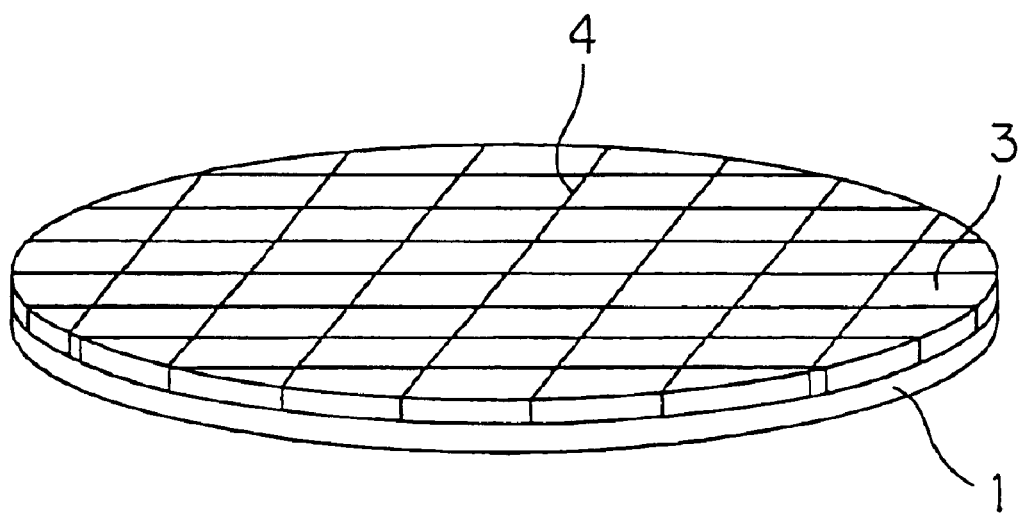
FIG. 2 is an illustrative perspective view showing a resin layer and semiconductor substrate formed with a cut groove.

FIG. 2 is an illustrative perspective view showing a resin layer 3 and wafer 1 formed with cut grooves 4.

The cut grooves 4 are formed in diagonal two directions and provided in plurality equidistantly. The cut grooves 4, in any, are in positions along the scribe lines.

It is preferred to carry out a forming process for a resin layer 3 and a forming process of cut grooves 4 in a continuous fashion in order not to cause such a temperature change as to cause a significant warp in the wafer 1. In the case there is a need to carry out a cut groove 4 forming process considerably after a resin layer 3 forming process, the wafer 1 formed with a resin layer 3 is preferably placed in such a temperature controlled environment as not to cause a warp due to a difference in expansion/contraction ratio of between the resin layer 3 and the wafer 1.

Next, the wafer 1 thus formed with a resin layer 3 is ground at its back surface 1b by the use of a grinder, for example, to adjust the wafer 1 to a desired thickness (FIG. 1D). In the case that the resin layer 3 is formed covering the summit of the projection electrode 2 and the resin layer 3 is planar in its surface, the wafer 1 upon grinding can be evenly pressurized at the side formed with the resin layer 3.

Thereafter, by etching the surface of the resin layer 3, the projection electrode 2 is exposed at its summit (FIG. 1E). Finally, dicing is made on the resin layer 3 and wafer 1 along the cut groove 4 (at a position forming the scribe line) by the use of a dicing blade, for separation into individual semiconductor chips 5 as shown in a perspective view of FIG. 3 (FIG. 1F). In this case, the dicing blade in use may be smaller in thickness than the dicing blade used in forming the cut grooves 4.

In this manner, according to this embodiment, because the resin layer 3 formed on the surface 1a of the wafer 1 is formed with cut grooves 4, no warp is caused due to a difference in thermal expansion/contraction of between the wafer 1 and the resin 3. Accordingly, because the wafer 1 subject to a grinding process (FIG. 1D) is planar, grinding can be made evenly in every point on the back surface 1b of the wafer 1. Due to this, the semiconductor chips 5 in plurality obtained by dicing through the cut process (FIG. 1F) have an even thickness.

Meanwhile, in the grinding process, the wafer 1 is reinforced in its entirety by the resin layer 3 formed on the surface 1a of the wafer 1. Accordingly, the wafer 1 can be ground favorably without causing breakage in the wafer 1. Thus, the wafer 1 can be advantageously thickness-reduced.

In addition, the wafer 1 is reinforced also during handling of the wafer 1 in the cut process or upon cutting of the wafer 1 by a dicing blade. There is no fear of causing breakage in the wafer 1 or semiconductor chips 5. Thus, it is possible to reduce the thickness of the wafer 1 to a desired thickness. This can contribute to thickness reduction in the semiconductor chips 5.

Figure 3:
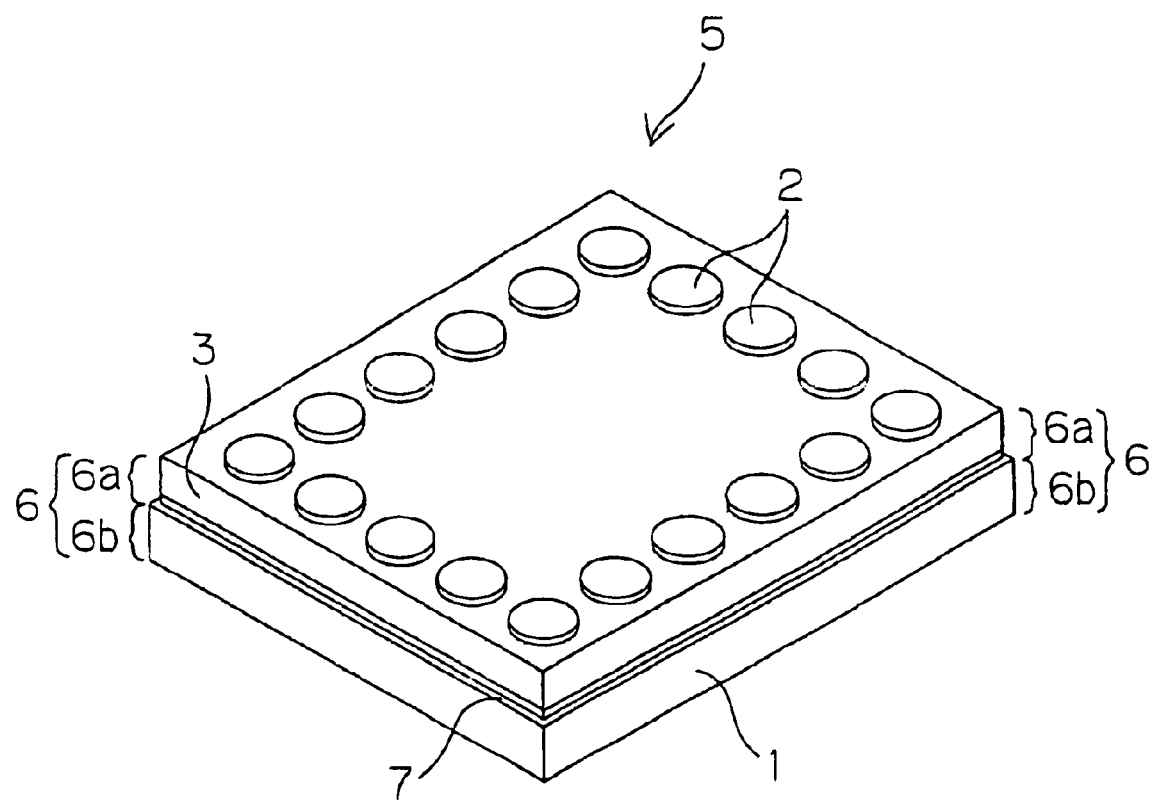
FIG. 3 is an illustrative perspective view of a semiconductor chip manufactured by the manufacturing method.
Figure 4:
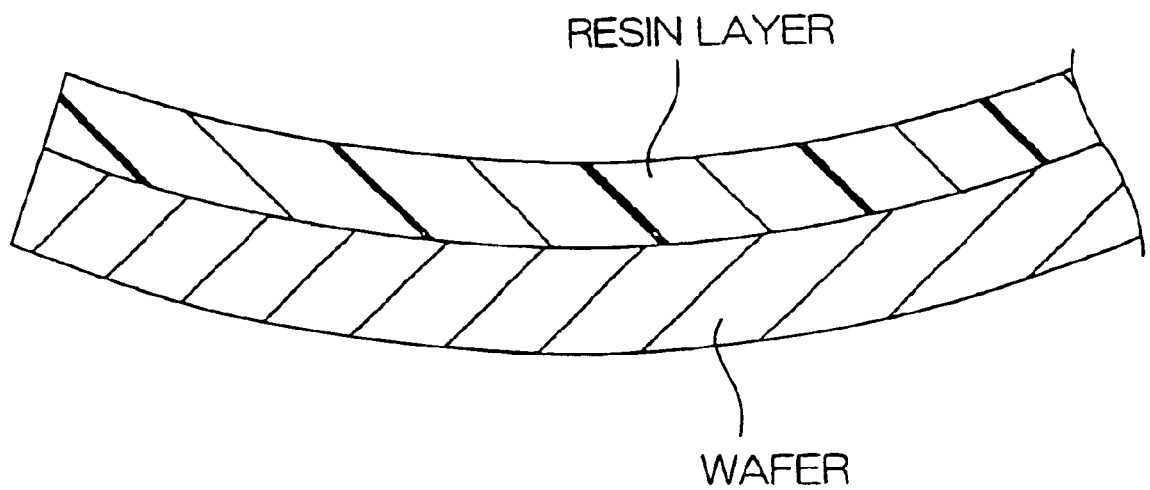
FIG. 4 is an illustrative view for explaining a problem of a warp to be caused in forming a resin layer on one surface of the wafer.

The semiconductor chip 5, in the final form, shown in FIG. 3 has a two-staged cut surface 6 in its side surface. Namely, the two-staged cut surface 6 includes a surface 6a obtained by cutting the resin layer 3 and part of the wafer 1 during forming the cut groove 4 (FIG. 1C), and a surface 6b obtained by cutting the remaining part of the wafer 1 during dicing (FIG. 1F). A step 7 is formed at a boundary between the surface 6a and the surface 6b.

In addition, the resin layer 3 protects the surface 1a (active surface) of the wafer 1 wherein the projection electrodes 2 are exposed from the resin layer 3. Accordingly, no further packaging is required for the semiconductor chip 5. Thus, it is possible to obtain a semiconductor package having a thickness fully reduced. Such a semiconductor package (semiconductor chip 5) can be mounted on a circuit board, in a position where the exposed projection electrodes 2 faces the electrode pads formed thereon (face down).

Incidentally, where a warp is caused in the wafer 1 due to a contraction during cure of the resin layer 3, a chuck, for example, may be used to hold the wafer 1 so that the formation of a resin layer 3 (liquefied-resin application and cure) and the cut grooves 4 are made while keeping the wafer 1 flat.

The number of cut grooves 4 can be determined arbitrarily as long as the stress applied to the wafer 1 is sufficiently reduced. In the above embodiment, the cut grooves 4 were formed along all the scribe lines. For example, cut grooves can be formed in a ratio of one per a predetermined number of scribe lines.

In the case of forming cut grooves 4 with a ratio of one per two scribe lines in the two orthogonal directions, the resulting semiconductor chip 5 has, multi-staged (usually, two-staged) cut surfaces for two not-orthogonal side surfaces, and surfaces cut once upon scribing for the other two side surfaces. Where cut grooves 4 are formed in a ratio of one per three scribe lines, a multi-staged cut surface is provided in only one of the side surfaces but multi-staged cut surfaces are provided in two of the side surfaces. Thus, it is possible to obtain semiconductor chips in a plurality of forms.

Although, in the foregoing embodiment, the cut grooves 4 were formed reaching the wafer 4, they may be formed to a depth of within the thickness of the resin layer 3. In this case, a step 7 is formed in a region of the resin layer 3 instead of in the wafer 1. Also in this case, relaxed is the stress caused due to a difference in thermal expansion/contraction of between the resin layer 3 and the wafer 1. The wafer 1 is prevented from being warped.

The process of removing a resin layer 3 and exposing a summit of a projection electrode 2 may be by a physical process such as grinding. In this case, the surface of resin layer 3 is flush with a summit of a projection electrode 2. According, even in the case that the resin layer 3 is first removed (ground) to expose the summit of the projection electrode 2, a grinding process (FIG. 1D) can be thereafter carried out by evenly pressurizing the wafer 1 at a side formed with the resin layer 3. Namely, such a method for manufacturing a semiconductor device provides a freedom in sequence of the processes to be carried out during manufacture.

Although the above embodiment shows a case of forming an interconnection on one surface of a semiconductor substrate 1 and thereafter forming a projection electrode 2, only one of an interconnection and a projection electrode may be formed for external connection. In even a case of not forming a projection electrode 2, an interconnection partially can be exposed from a resin layer 3 and connected to an electrode pad or the like of a circuit board. Besides the above, various modifications may be made within a scope of the description of the claims.

What is claimed is:

1. A method for manufacturing a semiconductor device comprising:

a step of forming at least one of a projection electrode and an interconnection on one surface of a semiconductor substrate;

a step of forming a resin layer on the one surface of the semiconductor substrate;

a grinding step for polishing or grinding the other surface of the semiconductor substrate, thereby reducing a thickness of the semiconductor substrate;

a step of forming a cut groove in the resin layer after the resin layer forming step but before the grinding step; and a step of cutting out individual semiconductor chip pieces by cutting the semiconductor substrate along a scribe line, wherein the grinding step is terminated before the cut groove is exposed from the other surface of the semiconductor substrate and the step of cutting out individual semiconductor chip pieces follows the grinding step.

2. The method according to claim 1, wherein the cut groove forming step includes a step of forming the cut grooves in two or more directions.

3. The method according to claim 1, wherein the cut groove forming step includes a step of forming the cut groove along a scribe line.

4. The method according to claim 1, further comprising a step of cutting out individual semiconductor chip pieces by cutting the semiconductor substrate along a scribe line.

5. The method according to claim 1, wherein the resin layer forming step includes a step of forming the resin layer to cover a top of the at least one of a projection electrode and an interconnection thereby.

6. The method according to claim 1, wherein the resin layer forming step includes a step of forming a resin layer with a flat surface, and wherein the grinding step includes a step of pressurizing the semiconductor substrate at a side formed with the resin layer.

7. The method according to claim 1, further comprising a step of removing a surface portion of the resin layer to expose the tops of the at least one of a projection electrode and an interconnection.

8. The method according to claim 1, the surface portion removing step includes the step of removing the surface portion of the resin layer by a physical process.

9. The method according to claim 1, wherein the cut groove forming step includes a step of forming the cut groove which is deep enough to reach the semiconductor substrate.

* * * * *